(12) United States Patent
Ionascu

(10) Patent No.: US 10,897,251 B1
(45) Date of Patent: Jan. 19, 2021

(54) ISOLATION BARRIER COMMUNICATION SYSTEM IN A PACKAGE FOR ISOLATED GATE DRIVER COMMUNICATION

(71) Applicant: Infineon Technologies Austria AG, Villach (AT)

(72) Inventor: Cristian Ionascu, Villach (AT)

(73) Assignee: Infineon Technologies Austria AG

( * ) Notice: Subject to any disclaimer, the term of this patent is extended or adjusted under 35 U.S.C. 154(b) by 0 days.

(21) Appl. No.: 16/852,892

(22) Filed: Apr. 20, 2020

(51) Int. Cl.
| | |
|---|---|
| *H03K 17/567* | (2006.01) |
| *H04B 10/50* | (2013.01) |
| *H02P 27/08* | (2006.01) |
| *H03K 5/24* | (2006.01) |

(52) U.S. Cl.
CPC ........... *H03K 17/567* (2013.01); *H02P 27/08* (2013.01); *H03K 5/2472* (2013.01); *H04B 10/502* (2013.01)

(58) Field of Classification Search
CPC .... H03K 17/567; H03K 5/2472; H02P 27/08; H04B 10/502
USPC .................................................. 327/108–112
See application file for complete search history.

(56) References Cited

U.S. PATENT DOCUMENTS

| | | | | |
|---|---|---|---|---|
| 9,812,989 | B1 * | 11/2017 | Dupuis | ................... H01L 25/50 |
| 10,084,446 | B2 * | 9/2018 | Caggegi | ............... H03K 17/687 |
| 10,511,273 | B2 * | 12/2019 | Al-Shyoukh | ......... H03F 3/2171 |
| 2011/0213227 | A1 * | 9/2011 | Ziv | ...................... A61B 5/0402 600/323 |
| 2015/0326223 | A1 * | 11/2015 | Baranwal | ............. H03K 17/689 327/551 |

FOREIGN PATENT DOCUMENTS

CN          206114874 U      4/2017

OTHER PUBLICATIONS

Texas Instruments Inc., "UCC23513 4-A Source, 5-A Sink, 5.7-kVRMS Opto-Compatible Single-Channel Isolated Gate Driver", Oct. 2018, [Online] URL: <http://www.ti.com/lit/ds/symlink/ucc23513.pdf>.
Silicon Laboratories, "Si826x 5 kV LED Emulator Input, 4.0 A Isolated Gate Drivers", Rev 1.5 Aug. 26, 2019, [Online] URL: <https://www.silabs.com/documents/public/data-sheets/Si826x.pdf>.

(Continued)

*Primary Examiner* — Tomi Skibinski
(74) *Attorney, Agent, or Firm* — Design IP

(57) ABSTRACT

A communication system includes a supply generator configured to generate a modulated supply according to a data transmission; a light emitting diode (LED) emulator including an emulator input coupled to the supply generator and an emulator output configured to output a sense voltage, wherein the emulator input is configured to receive a forward current derived from the modulated supply and translate the forward current into the sense voltage; a voltage comparator coupled to the emulator output and configured to receive the sense voltage and translate the sense voltage into a modulated output signal based on a communication voltage threshold; and a transmitter coupled to a comparator output and configured to receive the modulated output signal and generate a communication signal according to the data transmission based on the modulated output signal.

26 Claims, 4 Drawing Sheets

(56) References Cited

OTHER PUBLICATIONS

Toshiba Electronic Devices & Storage Corporation, "TLP152 Photocouplers GaAlAs Infrared LED & Photo IC", Rev 6.0, Dec. 19, 2017, [Online] URL: <toshiba.semicon-storage.com > info > docget > prodName=TLP152>.

Toshiba Corporation, "TLP241A,TLP241AF photocouplers, Photorelay", Rev. 3.0, Jan. 7, 2016, [Online] URL: <toshiba.semicon-storage.com > info > docget > prodName=TLP241A>.

* cited by examiner

ISOLATION BARRIER COMMUNICATION SYSTEM IN A PACKAGE FOR ISOLATED GATE DRIVER COMMUNICATION

BACKGROUND

A high voltage (HV) gate driver circuit may include a low voltage (LV) gate driver used to drive a low-side transistor switch and an HV gate driver used to drive a high-side transistor switch. The LV gate driver is arranged in a low voltage domain, whereas the HV gate driver is arranged in a high voltage domain. In practice, the gate driver also includes a termination region that isolates the high voltage domain from the low voltage domain, and may be referred to as an isolation termination region. Thus, the termination region provides a high voltage isolation barrier between the two voltage domains.

Typically, the HV gate driver receives control signals and possibly other communication signals from a circuitry located in the low voltage domain. Accordingly, these signals are transmitted from the low voltage domain through the termination region to the high voltage domain. Light emitting diode (LED) optocouplers can be used for transmitting signals from the low voltage domain to the high voltage domain. Specifically, a modulated current is transmitted through an LED located in the low-voltage domain. The amplitude of the current is modulated based on the data to be transmitted. The LED then transmits modulated light as a communication signal based on the modulated current. A receiver, including photo-transistor or a demodulator, is located in the high-voltage domain for receiving the light-modulated communication signal. Thus, the LED optocoupler transmits electrical signals between two isolated circuits by using light.

LED optocoupler emulators may also be used for transmitting signals between the two isolated circuits. LED optocoupler emulators do not include an LED, but instead "emulate" the input behavior of an optocoupler LED. However, these solutions are still being developed.

SUMMARY

One or more embodiments provide a communication system that includes a supply generator configured to generate a modulated supply according to a data transmission; a light emitting diode (LED) emulator including an emulator input coupled to the supply generator and an emulator output configured to output a sense voltage, wherein the emulator input is configured to receive a forward current derived from the modulated supply, wherein the LED emulator is configured to translate the forward current into the sense voltage; a voltage comparator including a comparator input coupled to the emulator output and including a comparator output, wherein the voltage comparator is configured to receive the sense voltage and translate the sense voltage into a modulated output signal based on a communication voltage threshold, wherein the voltage comparator generates the modulated output signal to have a first value on a first condition the sense voltage is equal to or greater than the communication voltage threshold and generates the modulated output signal to have a second value on a second condition the sense voltage is less than the communication voltage threshold; and a transmitter coupled to the comparator output and configured to receive the modulated output signal and generate a communication signal according to the data transmission based on the modulated output signal.

One or more embodiments further provide a gate driver system that includes a first region that operates in a first voltage domain; a second region that operates in a second voltage domain lower than the first voltage domain; a termination region that electrically isolates the first region and the second region; a gate driver arranged in the first region and configured to drive a transistor; and a communication system configured to transmit a communication signal across the termination region. The communication system includes a supply generator configured to generate a modulated supply according to a data transmission; a light emitting diode (LED) emulator including an emulator input coupled to the supply generator and an emulator output configured to output a sense voltage, wherein the emulator input is configured to receive a forward current derived from the modulated supply, wherein the LED emulator is configured to translate the forward current into the sense voltage; a voltage comparator including a comparator input coupled to the emulator output and including a comparator output, wherein the voltage comparator is configured to receive the sense voltage and translate the sense voltage into a modulated output signal based on a communication voltage threshold, wherein the voltage comparator generates the modulated output signal to have a first value on a first condition the sense voltage is equal to or greater than the communication voltage threshold and generates the modulated output signal to have a second value on a second condition the sense voltage is less than the communication voltage threshold; a transmitter coupled to the comparator output and configured to receive the modulated output signal and generate a communication signal according to the data transmission based on the modulated output signal; and a receiver configured to receive the communication signal and demodulate the communication signal.

One or more embodiments further provide a method of gate driver communication that includes generating a modulated supply according to a data transmission to produce a forward current; providing the forward current to an emulator input of a light emitting diode (LED) emulator; translating, by the LED emulator, the forward current into a sense voltage generated at an emulator output of the LED emulator; translating, by a voltage comparator, the sense voltage into a modulated output signal based on a communication voltage threshold, wherein the modulated output signal has a first value on a first condition the sense voltage is equal to or greater than the communication voltage threshold and the modulated output signal has a second value on a second condition the sense voltage is less than the communication voltage threshold; and generating, by a transmitter, a communication signal according to the data transmission based on the modulated output signal.

BRIEF DESCRIPTION OF THE DRAWINGS

Embodiments are described herein making reference to the appended drawings.

DETAILED DESCRIPTION

Figure 1:
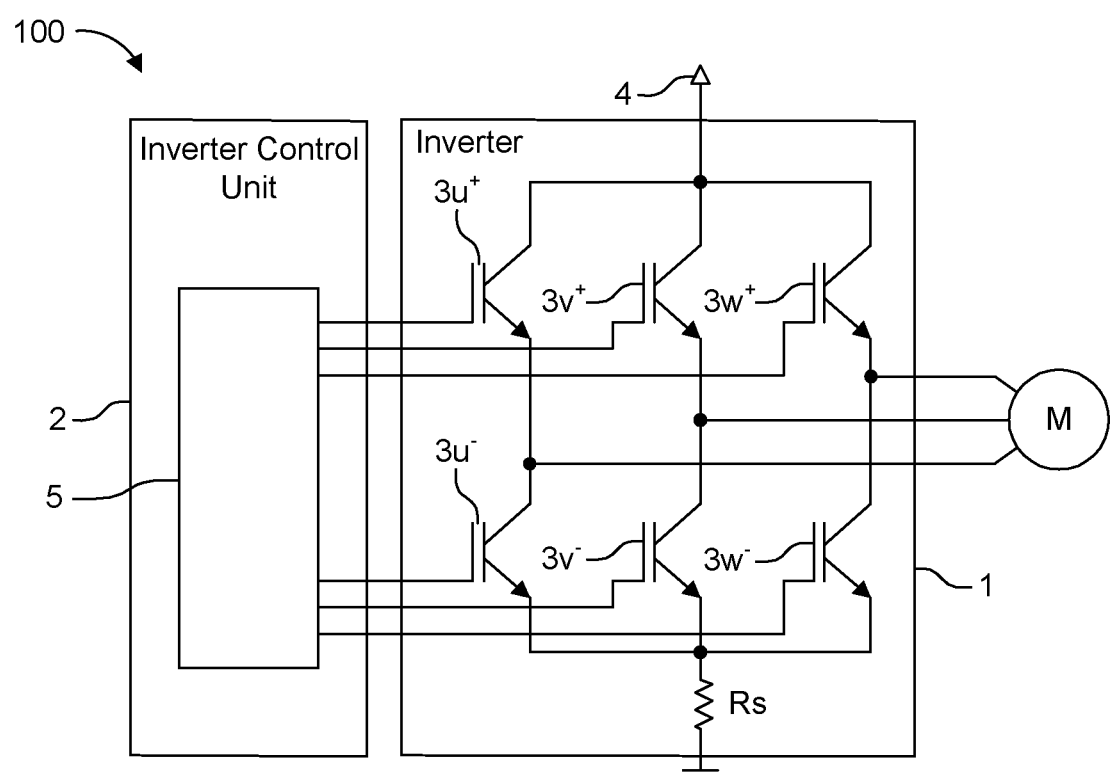
FIG. 1 is a schematic block diagram illustrating a control actuator of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load.

FIG. 1 is a schematic block diagram illustrating a control actuator 10 of a power semiconductor device according to one or more embodiments. In this example, the control actuator 100 is a motor control actuator for controlling and driving a motor. However, it will be appreciated that the control actuator 100 may controller and/or drive other types of loads. As such, FIG. 1 illustrates a non-limiting example of one use of the control actuator with the motor being one possible type of load.

The control actuator 10 includes a power inverter 1 and an inverter control unit 2. The inverter control unit 2 behaves as a control unit (e.g., motor control unit) and thus may also be referred to as a controller or a control IC (e.g., a motor controller or motor control IC). The control unit may be a monolithic IC or may be split into a microcontroller and a gate driver on two or more ICs.

In this example, the control actuator 10 is further coupled to a three-phase motor M, that includes three phases U, V, and W. The power inverter 1 is a three-phase current generator configured to provide three-phase power by supplying three phase currents to drive the motor M. It will be further appreciated that the power inverter 1 and the inverter control unit 2 may be placed on a same circuit board, or on separate circuit boards.

Deviations in both magnitude and phase may case a loss in power and torque in the motor M. Therefore, the control actuator 10 may be configured to monitor and control the magnitude and phase of the currents supplied to the motor M in real-time to ensure the proper current balance is maintained based on a feedback control loop. Open loop motor control units also exist and may be implemented.

The power inverter 1 includes a switching array of six transistor modules 3u+, 3u−, 3v+, 3v−, 3w+, and 3w− (collectively referred to as transistor modules 3) arranged in complementary pairs. Each complementary pair constitutes one inverter leg that supplies a phase current to the three-phase motor M. Thus, each inverter leg includes an upper (high-side) transistor module 3 and a lower (low-side) transistor module 3. Each transistor module may include one transistor, and may also include a diode (not shown). Thus, each inverter leg includes an upper transistor (i.e., a high-side switch) and a lower transistor (i.e., a low-side switch). Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes a motor control circuit and a gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A "monolithic" gate driver is a gate driver on a single silicon chip and may be further made with specific high voltage (HV) technology. Furthermore, the gate driver IC may be integrated on the power inverter 1 to form a power module.

The controller IC performs the control function of the control actuator 10 in real-time. When driving a motor, the control function is a motor control function can include either controlling a permanent magnet motor or an induction motor and can be configured as a sensorless control not requiring the rotor position sensing, as a sensor based control with Hall sensors and/or an encoder device, or as a combination of both sensor based control (e.g., used at lower rotor speeds) and sensorless control (e.g., used at higher rotor speeds).

For example, the inverter control unit 2 includes a controller and driver unit 5 that includes a microcontroller unit (MCU) as the controller IC and a gate driver IC for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the MCU, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller of the controller and driver unit 5 may use a motor control algorithm, such as a field-oriented control (FOC) algorithm, for providing current control in real-time for each phase current output to a multi-phase load, such a multi-phase motor. For example, during FOC, a motor phase current should be measured such that an exact rotor position can be determined in real-time. To implement the determination of the motor phase current, the MCU 5 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 2:
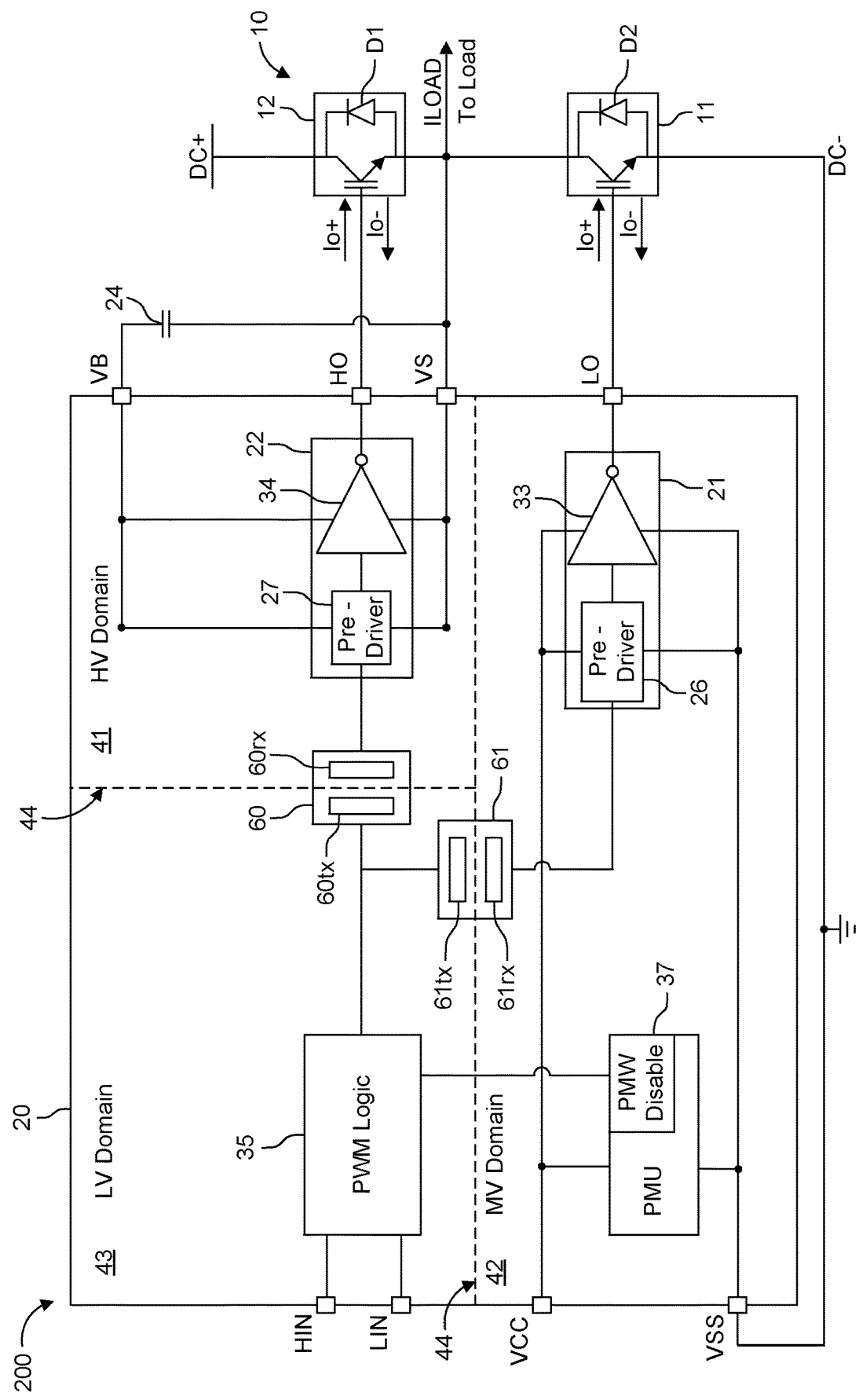
FIG. 2 is a schematic block diagram of a power module according to one or more embodiments.

FIG. 2 is a schematic block diagram of a power module 200 according to one or more embodiments. The power module 200 includes a single-phase drive stage 10 (i.e., an inverter leg) and a gate driver system 20 electrically coupled to the single-phase drive stage 10. However, the single-phase drive stage may be expanded to a multiple-phase drive state by adding additional inverter legs. Both the single-phase drive stage 10 and the gate driver system 20 are integrated into a single package (not illustrated). Thus, the power module 200 is packaged as a single device.

The single-phase drive stage 10 includes a low-side transistor 11 and a high-side transistor 12 that are controlled for supplying a load current $I_{LOAD}$ to a one phase of a load (not illustrated). Freewheeling diodes D1 and D2 coupled to their respective power transistors 11 and 12 are also shown.

The gate driver system 20 is a high voltage (HV) gate driver system, that includes a low-side (LS) gate driver 21 used to drive the low-side transistor switch 11 and a high-side (HS) gate driver 22 used to drive the high-side transistor switch 12. As will be explained later, the LS gate drive 21 and the HS gate driver 22 are located in different voltage domains of the gate driver system 20.

Both gate drivers 21 and 22 perform gate driving of their respective power transistor 11 and 12 based on digital PWM signals LIN and HIN received from a microcontroller unit (MCU). The PWM signals are control signals received from the MCU at PWM logic 35 of the gate driver system 20. The PWM logic 35 receives the LIN and HIN signals from the MCU and ensures there is a minimum dead time implemented to prevent bridge shoot through. Eventually, the respective PWM control signals are passed on to the respective low-side and high-side gate driver 21 and 22, where the PWM signal HIN is sent to the high-side gate driver 22. After this point, the low-side and high-side gate driver 21 and 22 perform gate driving.

Both gate drivers 21 and 22 include separate pre-driver circuitry 26 and 27 and buffers 33 and 34, respectively. The pre-driver circuitries 26 and 27 are configured to receive the PWM signals and, based thereon, control the on/off state of a respective first current source, such as a source FET, used to generate current Io+. Additionally, the pre-driver circuitries 26 and 27 are configured to receive the PWM signals and, based thereon, control the on/off state of a respective second current source, such as a sink FET, used to generate current Io−. The respective current sources are provided in buffers 33 and 34. Thus, the buffers 33 and 34 may each include a pair of complementary FETs used to generate turn-on currents Io+ and turn-off currents Io− for their respective power transistor 11 and 12. Each of the pre-driver circuitries 26 and 27 may further command a respective buffer 33 or 34 to use a certain current capability.

The low-side gate driver 21 is arranged in a low-side region defined by a medium voltage domain or a low voltage domain, whereas the high-side gate driver is arranged in a high-side region defined by a high voltage domain. In practice, the gate driver system 20 also includes a termination region 44 that isolates the different voltage domains from each other, and may be referred to as an isolation termination region. Thus, the termination region provides a voltage isolation barrier between two or more voltage domains.

The gate driver system 20 may be configured to receive PWM control signals, from an MCU, and turn on or turn off respective transistors 11 and 12 in accordance with the received PWM control signals. For example, during the turn-on process of a respective transistor 11 or 12, the gate driver system 20 may be used to provide (source) a gate current Io+ to the gate of the respective transistor 11/12 in order to charge the gate. In contrast, during the turn-off process, the gate driver system 20 may be used to draw (sink) a gate current Io− from the gate of the transistor 11/12 in order to discharge the gate.

Thus, the MCU is electrically coupled to the gate driver system 20 for the transmission of information signals and control signals HIN and LIN therebetween, and the gate driver system 20 is electrically coupled to the inverter leg 10 for driving the power transistors thereof.

Specifically, the MCU is configured to generate PWM control signals LIN and HIN for controlling the transistors 11 and 12, respectively, and transmit the control signals to the LV domain 43. For example, the gate driver system 20 is configured to receive instructions from the MCU to drive a load phase (i.e., an inverter leg) connected to voltage VS using the PWM control signals. These PWM control signals are received by the gate driver system 20 at the LV domain 43 (i.e., at input pins HIN and LIN) and passed through to the corresponding pre-driver circuitry 26 and 27 via the appropriate logic (e.g., the PWM logic 35). The buffers 33 and 34 are configured to receive the PWM control signals and drive the corresponding power transistor 11 and 12 via output terminals HO and LO of the gate driver system 20.

In this example illustrated in FIG. 2, four regions are present including: a high-side region defined by a HV domain 41, a low-side region defined by a medium-voltage domain (MV) domain 42 or mid-voltage domain, a low-voltage region defined by a LV domain 43, and a termination region 44. The LV domain 43 is a region that includes low-voltage devices, the MV domain 42 is a region that includes mid-voltage devices, and the HV domain 41 is a region that includes high-voltage devices. For example, low-voltage devices may be supplied with 0-5V, mid-voltage devices may be supplied with 0-30V, and high-voltage devices may be supplied with over 100 volts (e.g., 120V-160V). The voltage domains are not limited to these voltage ranges, but are instead intended to provide an example of one implementation. Nevertheless, general principle of different voltage domain levels at different voltage hierarchies remains intact.

The termination region 44 is represented by the dotted line between the different voltage domains. The termination region 44 isolates the different voltage domains from each other. Thus, the termination region 44 provides a voltage isolation barrier between the different voltage domains. The termination region 44 may be a unitary contiguous region or it may comprise two or more regions that are used to separate the various voltage domains.

The gate driver system 20 may be a multi-die gate driver having three separate voltage islands. In this case, each of the regions 41, 42, and 43 is a separate die or IC. The termination region 44 provides galvanic isolation between the ICs 41, 42, and 43 to galvanically separate the dies.

Figure 3:
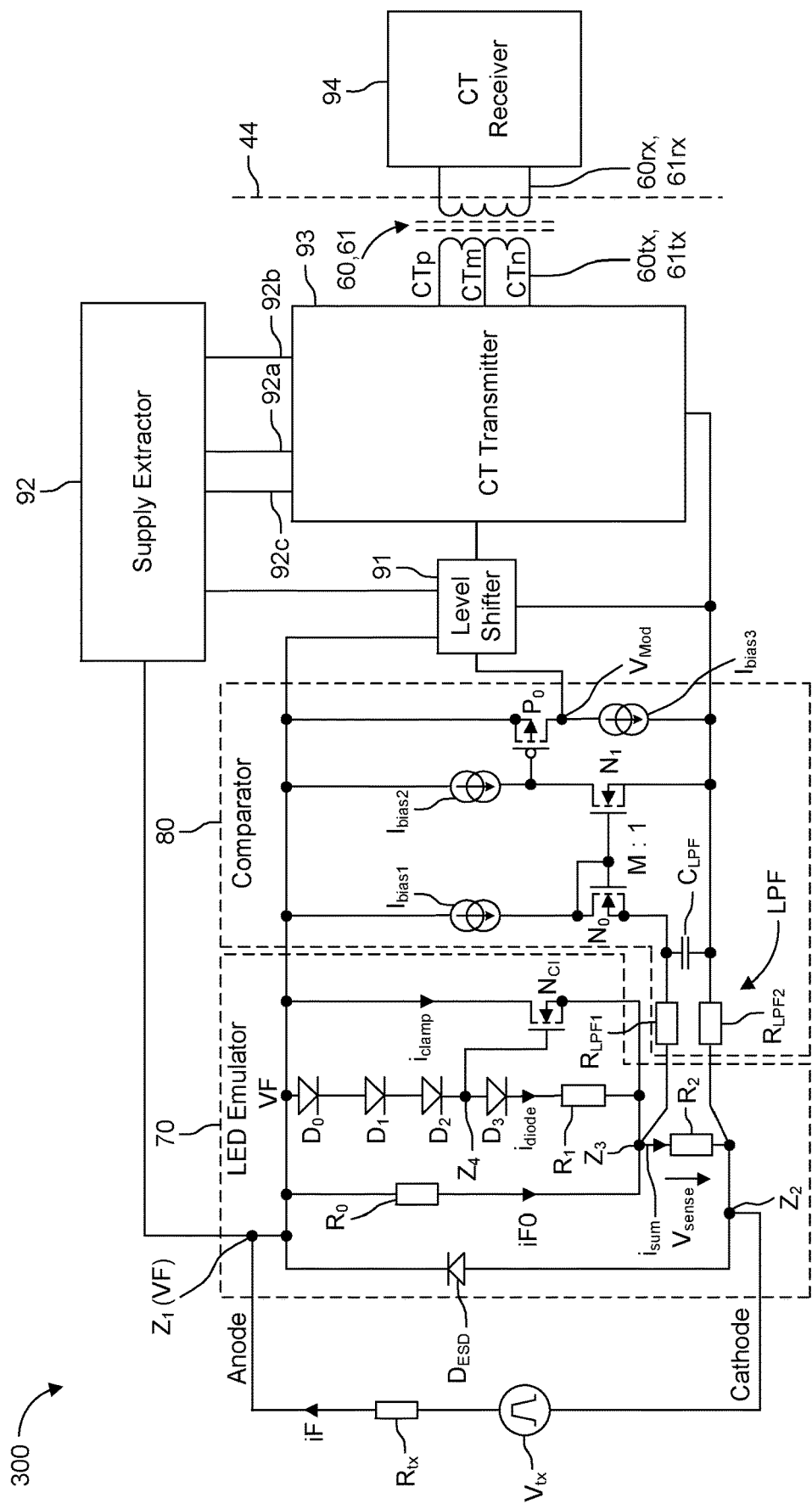
FIG. 3 illustrates a coreless transformer (CT) communication system that is implemented in a gate driver package for isolated gate driver communication according to one or more embodiments.

As will be described further in FIG. 3, the LV domain 43 provides information from the PWM logic 35 to the gate drivers 21 and 22 located in the other voltage domains 41 and 42 via transformers 60 and 61 indicated by pairs of transmitter (TX) coils 60tx and 61tx and receiver (RX) coils 60rx and 61rx, respectively. As such, a transformer 60 is configured to transmit electric signals (e.g., PWM control signals) from the PWM logic 35 to the gate driver 22 (i.e., from a first voltage domain to a second voltage domain). Additionally, a transformer 61 is configured to transmit electric signals (e.g., PWM control signals) from the PWM logic 35 to the gate driver 21 (i.e., from the first voltage domain to a third voltage domain).

While FIG. 2 shows a multi-die solution comprising three dies, it will be appreciated that two dies may also be used. In this case, respective components of the MV domain 42 and the LV domain 43 may be combined into the same voltage domain (e.g., an LV domain) such that they are integrated on a single die. The remaining die may comprise the HV domain 41 as shown in FIG. 2. Thus, only transformer 60 would be needed to transmit between the two existing voltage domains (e.g., the LV domain 43 and the HV domain 41).

While FIG. 2 shows an example comprising three isolated voltage domains, some embodiments may have a configuration in which there is no isolation between the MV domain 42 and the LV domain 43. In other words, the portion of the termination region 44 between the MV domain 42 and the LV domain 43 shown in FIG. 2 may not be present. In this case, the termination region 44 remains between the HV domain 41 and the other voltage domains 42 and 43 in order to isolate the HV domain 41 therefrom.

In addition, some embodiments may have a configuration in which the LV domain 43 is arranged entirely within the MV domain 42. In this case, the LV domain 43 may be a voltage island completely enclosed by a termination region 44 in order to isolate the LV domain 43 from the MV domain 42. Additionally, a termination region 44 remains between the HV domain 41 and the MV voltage domain 42 in order to isolate the HV domain 41 from the MV domain 42. Accordingly, the LV domain 43 is isolated from the MV domain 42, and the HV domain 41 is isolated from the MV domain 42. In naturally follows that the LV domain 43 and the HV domain 41 are also isolated from each other by two separate termination regions 44.

Alternatively, it will be appreciated that the four regions 41-44 may be monolithically built into a single integrated circuit. In a monolithic solution, termination regions within the die are used to isolate the different voltage domains, as similarly shown in FIG. 2. Here, the transformers 60 and 61 may be used to transmit electric signals between different voltage domains, as similarly illustrated in FIG. 2.

In either case, VB refers to the high-side floating supply voltage; VS refers to the high-side floating ground voltage; VDD or VCC refers to the low-side and logic fixed supply voltage; VSS or VEE refers to a low-side ground voltage; HO refers to the high-side floating output voltage; LO refers to the low-side output voltage; DC+ refers to DC-link positive; DC− refers to DC-link negative; and HIN and LIN refers to the logic input voltages (i.e., control signals) received from the MCU.

In one example, the gate driver system 20 may be operated in a common mode of 130V with a floating supply having maximum operating range of 30V. In this example, VB operates at a maximum of 160V, VS operates at a maximum of 130V, VCC operates at 30V, and VSS operates at 0V. In particular, VS is equal to DC+ when transistor 12 is on (and transistor 11 is off) and equal to DC− when transistor 11 is on (and transistor 12 is off). In both cases, VB remains at substantially 30V above VS due to the bootstrap capacitor 24. Thus, the low-side (external) supply voltage that supplies VCC may be set to 30V and the high-side supply voltage VB may be operated at a maximum voltage of 160V when DC+, equal to the common mode voltage, is 130V. DC− is tied to ground/VSS but does not have to be.

In another example, the gate driver system 20 may be operated in a common mode of 1500V with a floating supply having maximum operating range of 35V. In this example, VB operates at a maximum of 1535V, VS operates at a maximum of 1500V, VCC operates at 35V, and VSS operates at 0V. In particular, VS is equal to DC+ when transistor 12 is on (and transistor 11 is off) and equal to DC− when transistor 11 is on (and transistor 12 is off). In both cases, VB remains at substantially 35V above VS due to the bootstrap capacitor 24. Thus, the low-side (external) supply voltage that supplies VCC may be set to 35V and the high-side supply voltage VB may be operated at a maximum voltage of 1535V when DC+, equal to the common mode voltage, is 1500V. DC− is tied to ground/VSS but does not have to be.

It will be appreciated that the common mode voltage and the maximum operating range of the floating supply is configurable and may set at different voltages provided in the above two examples, including common mode voltages between 130-1500V, less than 30V, or greater than 1500V.

The aforementioned voltages are set such that the high-side voltage domain operates in a higher voltage or power domain than that of the low-side voltage domain. In addition, the medium-voltage or power domain is set at an intermediate level between the HV domain and the LV domain.

The HV domain 41 includes pre-driver circuitry 27, buffer 34, and a MV ESD device 51 coupled to VS and VB.

The LV domain 43 includes the PWM logic 35 and transmitter circuitry that transmits communication signals to the other voltage domains.

The MV domain 42 includes pre-driver circuitry 26 and buffer 33. It also includes a power management unit (PMU) 37 that is supplied by VSS and VCC. The PMU 37 is a microcontroller that governs and regulates power functions. For starters, the PMU 37 converts the medium supply voltage (i.e., VCC) to a low supply voltage (e.g., 5V) that is supplied to the LV domain 43. In particular, PMU 37 supplies the low supply voltage to the PWM logic 35. The PWM logic 35 uses the low supply voltage to perform its functions. Secondly, the PMU 37 is configured to monitor for faults and turn off the supply to the PWM logic 35 in the event an event occurs. By turning off the supply to the PWM logic 35, the PWM logic 35 is disabled and the high-side transistor 12 is turned off.

Further embodiments turn to communicating between voltage domains and transmitting electric signals therebetween across the termination region 44. FIG. 3 illustrates a coreless transformer (CT) communication system 300 that is implemented in a gate driver package for isolated gate driver communication according to one or more embodiments. The CT transmission system 300 includes a supply generator Vtx, an LED emulator circuit 70, a voltage comparator circuit 80, an optional level shifter 91, a supply extractor 92, a CT transmitter 93, and a CT receiver 94. The CT transmitter 93 is coupled to one of the TX coils 60tx or 61tx for transmitting CT signals (e.g., PWM control signals) and the CT receiver 94 is coupled to one of the RX coils 60rx or 61rx for receiving the CT signals. The CT transmission system 300 may be provided for each communication path that traverses two voltage domains. Thus, in FIG. 2, two CT communication systems 300 may be provided.

In the present example, the supply generator Vtx is a voltage generator that modulates its supply to generate forward current iF and forward voltage VF. However, a current generator that modulates its supply output may also be used as the supply generator Vtx to generate the forward current iF and the forward voltage VF. Since the supply generator Vtx is used to generate a voltage signal and/or a current signal, it may also be referred to as a signal generator.

The supply generator Vtx, the LED emulator circuit 70, the voltage comparator circuit 80, the optional level shifter 91, the supply extractor 92, and the CT transmitter 93 are arranged in the LV domain 43 and may be incorporated in the PWM logic 35. The CT receiver 94 is arranged across the termination region 44 in a different voltage domain to, for example, receive a respective PWM control signal. Additionally, or alternatively, the CT receiver 94 may be arranged in the LV domain 43 and the CT transmitter 93 may be arranged in the HV domain 41 to transmit feedback information to the PWM logic 35. Additionally, or alternatively, the CT receiver 94 may be arranged in the MV domain 42 and the CT transmitter 93 may be arranged in the HV domain 41 to transmit feedback information to the PMU 37.

The LED emulator circuit 70 is intended to replace current modulated light communication specific to optocouplers. Specifically, the LED emulator circuit 70 is a current extraction circuit that emulates the LED behavior of an LED optocoupler.

The voltage comparator circuit 80 receives an output, Vsense, of the LED emulator circuit 70 and translates Vsense into a modulated output signal Vmod. The modulated signal Vmod is used to trigger (enable) or disable a carrier wave generated by the CT transmitter 93. As a result, the modulated output signal Vmod is a communication control signal for on/off keying of the CT transmitter 93.

In particular, the CT transmitter 93 generates a communication signal comprising data bits of binary ones and binary zeros. For example, the communication signal may be a PWM control signal. The binary symbol 1 is represented by transmitting a fixed-amplitude carrier wave and fixed frequency for a bit duration of T seconds. If the signal value is 1 then the carrier signal will be transmitted; otherwise, a signal value of 0 will be transmitted. Thus, the carrier wave is enabled based on the modulated output signal Vmod of the voltage comparator circuit 80, which depends on the value of the sense voltage Vsense provided at the output of the LED emulator circuit 70 which is coupled to the input of the voltage comparator circuit 80. The carrier wave may be a sinusoidal carrier or a rectangular signal comprising pulses.

Accordingly, the CT transmitter 93 may be an on/off keying (e.g., amplitude-shift keying (ASK)) transmitter where the modulated ON pulse is transmitted through to a secondary chip with the help of a CT receiver circuit 94 via inductive coupling (e.g., via a transformer). The CT receiver 94 may be an on/off keying demodulator. The secondary chip may be a die that is defined by the HV domain 41 or the MV domain 42.

As stated above, the CT transmission system 300 includes a supply generator Vtx, such as a voltage oscillator, that generates a modulated supply voltage according to data to be transmitted. A resistor Rtx provides an electrical pathway to the LED emulator circuit 70. A forward current iF is produced based on the modulated supply voltage and the value of resistor Rtx, among other resistances.

The LED emulator circuit 70 includes an anode node Z1 that emulates an anode of an LED at which a forward voltage VF (i.e., an anode voltage) is present. As such, the anode node Z1 may be referred to as a forward voltage node or an input node. The forward voltage VF is the anode voltage resulting from the current injection as forward current iF. Similarly, the LED emulator circuit 70 includes a cathode node Z2 that emulates a cathode of an LED at which a cathode voltage is present. As such, the cathode node Z2 may be referred to as an output node or a sense node.

The LED emulator circuit 70 further includes resistor R0 and sense resistor R2 connected in series between the forward voltage node and the cathode node Z2. Specially, resistor R0 is coupled between nodes Z1 and Z3 and resistor R1 is coupled between nodes Z3 and Z2.

An active shunt-regulated clamp circuit is connected in parallel to resistor R0. The active shunt-regulated clamp circuit includes a diode chain of four diodes D0, D1, D2, and D3 as well as a resistor R1 connected in series between nodes Z1 and Z3. The active shunt-regulated clamp circuit further includes a clamping transistor Ncl that is also coupled in parallel to resistor R0 (i.e., between nodes Z1 and Z3). For example, the clamping transistor Ncl may be an n-channel MOSFET with its drain terminal connected to node Z1, its source terminal connected to node Z3, and its gate terminal connected to node Z4 that is connected between the last pair of the diode chain, diodes D2 and D3 (i.e., connected to the cathode of diode D2 and the anode of diode D3).

Lastly, the LED emulator circuit 70 includes a diode $D_{ESD}$ that is connected to nodes Z1 and Z2 in a reverse biased arrangement to provide protection against electrostatic discharges (ESD).

At approximately 1 mA forward current iF, the resistor R0 is used to emulate a forward voltage of an emulated optocoupler LED. For example, resistances of Rtx, R0, and R2 may be selected to be approximately 970 ohms, with R0 and R2 having a sum of approximately 700 ohms in this example. Thus, when voltage Vtx is 1.0V, the forward voltage VF (at the anode node Z1) is approximately 0.7V and the forward current iF through resistors R0 and R2 is approximately 1 mA. The diode chain D0-D3 remains off since there is not enough voltage to forward bias all four diodes. Here, it is assumed for the purposes of explanation only that each of the diodes D0-D3 has a forward voltage of 0.65V. Thus, a forward voltage VF of approximately 2.6V is needed to forward bias all four diodes D0-D3 and for diode current idiode to flow through the diode chain D0-D3

When a binary 1 data bit is desired, the voltage generator Vtx increases its output voltage to increase the forward voltage VF flowing into node Z1. Conversely, when a binary 0 data bit is desired, the voltage generator Vtx decreases its output voltage to decrease the forward voltage VF flowing into node Z1.

When a binary 1 data bit is desired, the forward voltage VF is increased. When the forward voltage VF is approximately 2.6V, all four diodes D0-D3 of the diode chain are forward biased, the clamping transistor Ncl is turned on, and a fixed-amplitude carrier wave is triggered via the voltage comparator circuit 80. As the voltage generator Vtx continues to increase its supply voltage to its peak level, the diode chain D0-D3 remains forward biased but the excess current iclamp generated by the increased supply voltage flows through the clamping transistor Ncl in order to clamp the forward voltage to approximately 2.6V (i.e., voltage needed to forward bias the diode chain D0-D3 plus a voltage drop across the resistor R1) depending on the value of resistor R1. In other words, the clamped forward voltage may be adjusted by changing the resistance of the resistor R1. For example, the forward voltage may be clamped at a value between 2.6V and 3.1V depending on the value of the resistor R1.

By clamping the forward voltage VF, the clamping transistor Ncl prevents the forward voltage VF from increasing to levels that could damage the LED emulator circuit 70 (e.g., the diodes D0-D3) and/or the voltage comparator circuit 80, since many components are supplied by the forward voltage VF. Therefore, the clamping transistor Ncl serves to protect the circuitry by limiting the forward voltage VF to a safe operation level.

As a result, the forward bias threshold of the diode chain D0-D3 is a forward voltage threshold for triggering the fixed-amplitude carrier wave. When the forward voltage VF meets at least this forward bias threshold, currents iF0, idiode, and iclamp are summed together at node Z3 as a summed current isum that flows through the sense resistor R2.

It is also noted that when the forward voltage VF is less than this forward bias threshold, the summed current isum is equal to the current iF0 flowing through resistor R0 since the other parallel branches are disabled. In that case, the forward voltage VF varies in proportion to the forward current iF according to Ohm's Law.

Thus, the voltage drop (the sense voltage Vs) across the sense resistor R2 varies based on the summed current isum, and the summed current varies based on the supply being driven by the voltage generator Vtx. In either case, the summed current isum is equal to the forward current iF. Thus, these two currents can be used interchangeably.

Through the sense voltage Vs, the summed current isum is used by the voltage comparator circuit 80 for triggering an emulated light emission. As noted above, when the forward current iF increases due the communication needs of transmitting a binary 1 data bit, the forward voltage VF is clamped by the active shunt-regulated clamp circuit that includes the clamping transistor Ncl, the diode chain D0-D3, and resistor R1. The extra current exceeding a threshold current value is passed through the active shunt-regulated clamp circuit.

When the forward current iF is less than the threshold current value for emulated light emission, the voltage at node Z4 is insufficient to turn on the clamping transistor Ncl. Thus, substantially all current is passed through resistor R0 when the forward current iF is less than the threshold current value. In this case, the total summed current isum is equal to the initial forward current iF0 and the summed current isum flows through the sense resistor R2 which produces a voltage drop, sense voltage Vsense. The voltage drop Vsense is representative of the summed current isum, which may also be referred to as a signaling current.

When the forward current iF reaches the threshold current value for emulated light emission (i.e., when the forward voltage VF equals the forward voltage threshold), the active shunt-regulated clamp circuit acts as a shunt regulator by keeping the forward voltage VF clamped to approximately four diode voltage drops 4Vd of the diode chain D0-D3 plus the voltage drop of resistor R1.

Accordingly, the voltage across the diode chain D0-D3 (and between nodes Z1 and Z3) will remain practically steady for a wide range of forward currents iF that meet or exceed the threshold current value. Additionally, the voltage at node Z4, which controls the gate of the clamping transistor Ncl, is sufficient for the clamping transistor Ncl to turn on and maintain it in active mode. The voltage at node Z4 is also clamped to a fixed value. The voltage comparator circuit 80 is a self-biased ΔVgs comparator (i.e., a dVgs comparator or delta Vgs comparator) used for dynamic voltage comparison and dynamic, real-time modulation of the modulated signal Vmod. With the help of sense resistor R2, the voltage comparator circuit 80 translates the signaling current (isum) into a voltage decision. The signaling current is used to signal to the CT transmitter 93, via the voltage comparator 80, whether to generate the carrier wave or not for the communication signal.

In particular, the voltage comparator circuit 80 continuously monitors the sense voltage Vsense, representative of the signaling current (isum), and translates the sense voltage Vsense into a modulated signal Vmod. For example, when the sense voltage Vsense meets or exceeds a communication voltage threshold value (corresponding to the threshold current value), the voltage comparator circuit 80 generates the modulated signal Vmod having a first value that triggers the fixed-amplitude carrier wave. In contrast, when the sense voltage Vsense is less than the communication voltage threshold value, the voltage comparator circuit 80 generates the modulated signal Vmod having a second value that disables the fixed-amplitude carrier wave.

In essence, the voltage comparator circuit 80 continuously compares the sense voltage Vsense with a communication voltage threshold value and modulates the modulated output signal Vmod based on the comparison result. The comparison is done by the cascading effect of the transistor devices being turned on or off based on the sense voltage Vsense received at the input of the voltage comparator circuit 80.

The voltage comparator circuit 80 includes a low pass filter (LPF) that includes two resistors $R_{LPF1}$ and $R_{LPF2}$ that are coupled across the sense resistor R2 (i.e., each is coupled to a different terminal of the sensor resistor R2), thereby configured to extract the sense voltage Vsense from the LED emulator circuit 70. The LPF also includes a capacitor $C_{LPF}$. The LPF is configured to remove noise from the signaling current or the sense voltage Vsense caused by the voltage generator Vtx.

The voltage comparator circuit 80 further includes an M:1 current mirror, where M is an integer greater than zero. The current mirror includes transistors N0, N1, and P0 and self-biased current sources Ibias1, Ibias2, and Ibias3 that produce equal currents. Transistors N0 and N1 are n-channel MOSFETs and P0 is a P-channel MOSFET. The transistor P0 is also an output transistor of the voltage comparator circuit 80 that modulates the modulated output signal Vmod based on the sense voltage Vsense.

If the signaling current (isum) is less than the threshold current value, the sense voltage Vsense is less than the communication voltage threshold value and the modulated output signal Vmod of the voltage comparator circuit 80 is pulled low to approximately zero (i.e., logic low). In particular, when the sense voltage Vsense is less than the communication voltage threshold value, the source terminal of transistor N0 is low resulting in transistor N1 being turned off.

In particular, transistor N0 has its own Vgs=Vds given by Ibias1 and Vgs of transistor N1 is defined by Ibias2. Accordingly, if Ibias1 is equal Ibias2, Vgs of N1>Vgs of N0 due to gain factor M. Therefore, when the sense voltage Vsense is low (i.e., less than a communication threshold), Vgs N0 will be insufficient to drive transistor N1 to turn on when Ibias=Ibias1=Ibias2. Hence, transistor N1 is turned off.

When transistor N1 is turned off, the gate of the output transistor P0 is pulled high to the forward voltage VF by the current source Ibias2, thereby turning off the output transistor P0. When the output transistor P0 is off, the modulated output signal Vmod is pulled low by the current source Ibias3.

When the modulated output signal Vmod is in a low state, the fixed-amplitude carrier wave is disabled for the communication signal and the communication signal is transmitted by the CT transmitter 93 with a signal value of zero. The CT receiver 94 is configured to receive the communication signal and interpret the zero signal value over a bit duration of T seconds as a binary symbol 0.

Conversely, if the signaling current (isum) is equal to or greater than the threshold current value, the sense voltage Vsense is equal to or greater than the communication voltage threshold value and the modulated output signal Vmod of the voltage comparator circuit 80 is pulled high to the forward voltage VF (i.e., logic high). In particular, when the sense voltage Vsense is equal to or greater than the communication voltage threshold value, the source terminal of transistor N0 is high (i.e., above a communication threshold). Since Vgs of transistor N0 is defined by Ibias1, which is much smaller than the signaling current isum, the increase of the sense voltage Vsense will cause the voltage at the drain and the gate terminals of transistor N0 to be increased by current source Ibias1, resulting in the gate terminal of transistor N1 being high and transistor N1 being turned on. When transistor N1 is turned on, the gate of the output transistor P0 is pulled low, thereby turning on the output transistor P0. When the output transistor P0 is on, the modulated output signal Vmod is pulled high to the forward voltage VF.

When the modulated output signal Vmod is in a high state, the fixed-amplitude carrier wave is enabled. When the fixed-amplitude carrier wave is enabled, the CT transmitter 93 is configured to generate the fixed-amplitude carrier wave for the transmitted communication signal. The CT receiver 94 is configured to receive the communication signal and interpret fixed-amplitude carrier wave over a bit duration of T seconds as a binary symbol 1.

The transmitter coil 60tx, 61tx is coupled to the output of the CT transmitter 93 and is configured to transmit the communication signal. The transmitter coil 60tx, 61tx include a positive terminal CTp, a negative terminal CTn, and a reference or mid-point terminal CTm.

Similarly, the receiver coil 60rx, 61rx is coupled to the input of the CT receiver 94 and is configured to receive the communication signal via inductive coupling.

The supply extractor 92 is configured to tap or extract the forward voltage VF from node Z1 in order to supply power to the CT transmitter 93 via supply lines 92a and 92b. Supply line 92a may be coupled to the positive terminal CTp and supply ling 92b may be coupled to the negative terminal CTn.

In some cases, the CT transmitter 93 requires a higher voltage than supplied by the forward voltage VF. When this is the case, the supply extractor 92 may convert the forward voltage VF into one or more a higher power signals (e.g., into either a higher voltage or a higher current equivalent).

In addition, when the CT transmitter 93 requires a higher voltage than supplied by the forward voltage VF, the optional level shifter 91 is provided in order to level shift or translate the modulated output signal Vmod into a higher-voltage equivalent signal that can be processed by the CT transmitter 93.

As one example, the supply extractor 92 is a ring oscillator and charge-pump with pre-biasing and a fast settling time. The ring oscillator generates a clock signal that is transmitted via signal line 92c for the generation of the on/off keying carrier wave. That is, the CT transmitter 93 uses the clock signal to generate the carrier wave. The charge pump may approximately double the input voltage (i.e., the forward voltage VF) and it is used for providing larger amplitudes to the coil supply of CT transmitter 93. However, the supply extractor 92 can be much simpler is design (without charge pump) and strictly determined by the CT transmitter 93 being a load.

Figure 4:
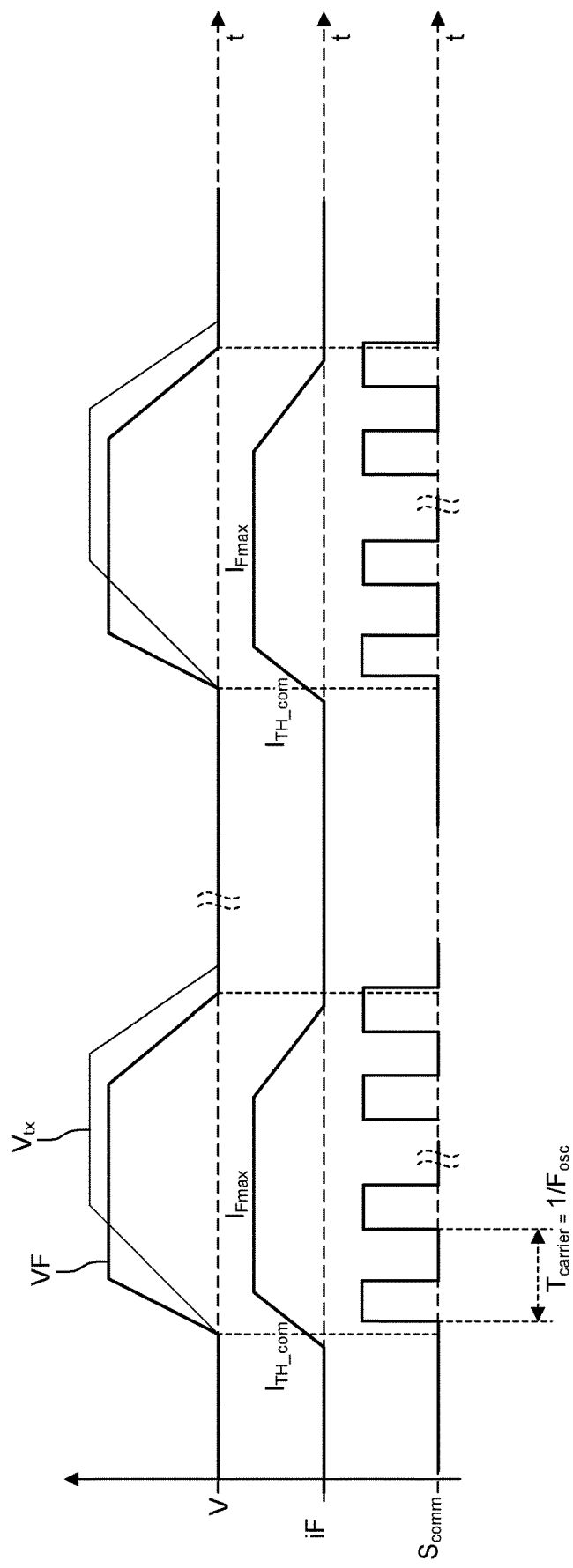
FIG. 4 illustrates various signal diagrams of a communication protocol according to one or more embodiments.

FIG. 4 illustrates various signal diagrams of a communication protocol according to one or more embodiments. The top signal diagram illustrates an example of voltages VF and Vtx in relation to each other. The forward voltage VF is limited (clamped) to a fixed forward voltage by the active shunt-regulated clamp circuit.

The middle signal diagram illustrates the forward current iF in relation to voltages VF and Vtx. The forward current iF reaches a maximum forward current iFmax based on the peak voltage of Vtx. As the forward current iF increases or decreases, it passes a threshold current value $I_{TH\_com}$ (i.e., a communication threshold). If the forward current iF meets or exceeds the threshold current value $I_{TH\_com}$, a carrier wave is triggered (enabled) by the CT transmitter 93 for the communication signal Scomm. If the forward current iF is less than the threshold current value $I_{TH\_com}$, the carrier wave is disabled by the CT transmitter 93 for the communication signal Scomm.

This bottom signal diagram illustrates the communication signal Scomm generated by the CT transmitter 93 according to the modulated output signal Vmod described above. The modulated output signal Vmod is modulated based on the threshold crossings illustrated in the middle signal diagram. As can be seen, the carrier wave is enabled based on the forward current iF and the threshold current value $I_{TH\_com}$. The sense voltage Vsense is modulated based on the forward current iF. The carrier wave has a period of Tcarrier which is the inverse of the oscillator frequency Fosc of the clock signal provided by the supply extractor 92.

In view of the above, the following advantages may be realized. A higher switching frequency may be used due to the fast response time of the LED emulator circuit 70 and the voltage comparator circuit 80. A higher common mode transient immunity (CMTI) may be realized by using CT communication system. The determination of the communication voltage threshold by the voltage comparator circuit 80 is faster and more accurate. The complexity of the supply extractor 92 can be reduced to the central bias generation and oscillator for a carrier of an ASK system, which is linked directly to the CT communication transmitter 93 and the complexity of the ASK CT system.

While various embodiments have been disclosed, it will be apparent to those skilled in the art that various changes and modifications can be made which will achieve some of the advantages of the concepts disclosed herein without departing from the spirit and scope of the invention. For example, while the above-described embodiments are directed to transmitters that use coreless transformers (i.e., inductive coupling transmissions), transformers 60 and 61 may be exchanged with a different type of transmitter, including capacitive transmitters that use capacitive coupling for the transmission of data. Thus, other transmitter types may be used and it will be obvious to those reasonably skilled in the art that other components performing the same or similar functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A communication system, comprising:
   a supply generator configured to generate a modulated supply according to a data transmission;

a light emitting diode (LED) emulator comprising an emulator input coupled to the supply generator and an emulator output configured to output a sense voltage, wherein the emulator input is configured to receive a forward current derived from the modulated supply, wherein the LED emulator is configured to translate the forward current into the sense voltage;

a voltage comparator comprising a comparator input coupled to the emulator output and comprising a comparator output, wherein the voltage comparator is configured to receive the sense voltage and translate the sense voltage into a modulated output signal based on a communication voltage threshold, wherein the voltage comparator generates the modulated output signal to have a first value on a first condition the sense voltage is equal to or greater than the communication voltage threshold and generates the modulated output signal to have a second value on a second condition the sense voltage is less than the communication voltage threshold; and a transmitter coupled to the comparator output and configured to receive the modulated output signal and generate a communication signal according to the data transmission based on the modulated output signal.

2. The communication system of claim 1, wherein the transmitter is an on/off keying transmitter configured to generate a carrier wave as the communication signal in response to the modulated output signal having the first value and configured to generate the communication signal without the carrier wave in response to the modulated output signal having the second value.

3. The communication system of claim 2, wherein a forward voltage is produced at the emulator input and the communication system further comprises:

a supply extractor coupled to the emulator input and configured to receive the forward voltage and provide a supply voltage derived from the forward voltage to the transmitter to supply power thereto.

4. The communication system of claim 3, wherein:

the supply extractor comprises an oscillator configured to generate a clock signal and transmit the clock signal to the transmitter, and the transmitter is configured to receive the clock signal and generate a carrier wave based on the clock signal.

5. The communication system of claim 1, wherein the voltage comparator is configured to continuously monitor the sense voltage and continuously generate the modulated output signal.

6. The communication system of claim 1, wherein the voltage comparator is a $\Delta V_{gs}$ comparator.

7. The communication system of claim 1, wherein the LED emulator comprises:

a first current path coupled between the emulator input and the emulator output for conducting at least a first portion of the forward current; and an active shunt-regulated clamp circuit coupled between the emulator input and the emulator output in parallel to the first current path, wherein the active shunt-regulated clamp circuit is disabled on a third condition that the forward current is less than a forward current threshold, and wherein the active shunt-regulated clamp circuit is enabled on a fourth condition that the forward current is equal to or greater than a forward current threshold.

8. The communication system of claim 7, further comprising:

a sense resistor coupled to the emulator output and configured to receive currents flowing through the first current path and through the active shunt-regulated clamp circuit, wherein a summation of the currents produces a signaling current that flows through the sensor resistor that generates the sense voltage at the emulator output.

9. The communication system of claim 7, wherein:

the first condition is satisfied in response to the fourth condition being satisfied, and the second condition is satisfied in response to the third condition being satisfied.

10. The communication system of claim 9, wherein the forward current threshold has a predefined relationship to the communication voltage threshold.

11. The communication system of claim 7, wherein the active shunt-regulated clamp circuit comprises:

a second current path comprising a diode chain of a plurality of diodes connected in parallel to the first current path; and a third current path comprising a clamping transistor connected in parallel to the first current path, the clamping transistor including a control terminal coupled to a node that is coupled between a pair of diodes of the plurality of diodes.

12. The communication system of claim 11, wherein the diode chain is fully forward biased in response to the fourth condition being satisfied.

13. The communication system of claim 11, wherein:

a forward voltage is produced at the emulator input, the active shunt-regulated clamp circuit is configured to clamp the forward voltage is to a fixed forward voltage in response to the fourth condition being satisfied, and the forward voltage varies in proportion to the forward current in response to the third condition being satisfied.

14. A gate driver system, comprising:

a first region that operates in a first voltage domain;

a second region that operates in a second voltage domain lower than the first voltage domain;

a termination region that electrically isolates the first region and the second region;

a gate driver arranged in the first region and configured to drive a transistor; and a communication system configured to transmit a communication signal across the termination region, the communication system comprising:

a supply generator configured to generate a modulated supply according to a data transmission;

a light emitting diode (LED) emulator comprising an emulator input coupled to the supply generator and an emulator output configured to output a sense voltage, wherein the emulator input is configured to receive a forward current derived from the modulated supply, wherein the LED emulator is configured to translate the forward current into the sense voltage;

a voltage comparator comprising a comparator input coupled to the emulator output and comprising a comparator output, wherein the voltage comparator is configured to receive the sense voltage and translate the sense voltage into a modulated output signal based on a communication voltage threshold, wherein the voltage comparator generates the modulated output signal to have a first value on a first condition the sense voltage is equal to or greater than the communication voltage threshold and generates the modulated output signal to have a second value on a second condition the sense voltage is less than the communication voltage threshold;

a transmitter coupled to the comparator output and configured to receive the modulated output signal and generate a communication signal according to the data transmission based on the modulated output signal; and a receiver configured to receive the communication signal and demodulate the communication signal.

15. The gate driver system of claim 14, wherein the supply generator, the LED emulator, the voltage comparator, and the transmitter are arranged in the second region and the receiver is arranged in the first region.

16. The gate driver system of claim 15, wherein:
the communication signal is a pulse width modulation (PWM) control signal, and
the gate driver is coupled to the receiver and is configured to receive the PWM control signal from the receiver and drive the transistor based thereon.

17. The gate driver system of claim 14, wherein the first region is a first semiconductor die and the second region is a second semiconductor die.

18. The gate driver system of claim 14, wherein the transmitter is an on/off keying transmitter configured to generate a carrier wave as the communication signal in response to the modulated output signal having the first value and configured to generate the communication signal without the carrier wave in response to the modulated output signal having the second value.

19. The gate driver system of claim 14, wherein the LED emulator comprises:
a first current path coupled between the emulator input and the emulator output for conducting at least a first portion of the forward current; and
an active shunt-regulated clamp circuit coupled between the emulator input and the emulator output in parallel to the first current path,
wherein the active shunt-regulated clamp circuit is disabled on a third condition that the forward current is less than a forward current threshold, and
wherein the active shunt-regulated clamp circuit is enabled on a fourth condition that the forward current is equal to or greater than a forward current threshold.

20. The gate driver system of claim 19, wherein:
the first condition is satisfied in response to the fourth condition being satisfied, and
the second condition is satisfied in response to the third condition being satisfied.

21. The gate driver system of claim 19, wherein the active shunt-regulated clamp circuit comprises:
a second current path comprising a diode chain of a plurality of diodes connected in parallel to the first current path; and
a third current path comprising a clamping transistor connected in parallel to the first current path, the clamping transistor including a control terminal coupled to a node that is coupled between a pair of diodes of the plurality of diodes.

22. The gate driver system of claim 21, wherein:
a forward voltage is produced at the emulator input,
the active shunt-regulated clamp circuit is configured to clamp the forward voltage is to a fixed forward voltage in response to the fourth condition being satisfied, and
the forward voltage varies in proportion to the forward current in response to the third condition being satisfied.

23. A method of gate driver communication, comprising:
generating a modulated supply according to a data transmission to produce a forward current;
providing the forward current to an emulator input of a light emitting diode (LED) emulator;
translating, by the LED emulator, the forward current into a sense voltage generated at an emulator output of the LED emulator;
translating, by a voltage comparator, the sense voltage into a modulated output signal based on a communication voltage threshold, wherein the modulated output signal has a first value on a first condition the sense voltage is equal to or greater than the communication voltage threshold and the modulated output signal has a second value on a second condition the sense voltage is less than the communication voltage threshold; and
generating, by a transmitter, a communication signal according to the data transmission based on the modulated output signal.

24. The method of claim 23, wherein the transmitter is an on/off keying transmitter configured to generate a carrier wave as the communication signal in response to the modulated output signal having the first value and configured to generate the communication signal without the carrier wave in response to the modulated output signal having the second value.

25. The method of claim 23, further comprising:
conducting at least a first portion of the forward current through a first current path coupled between the emulator input and the emulator output;
disabling, on a third condition that the forward current is less than a forward current threshold, an active shunt-regulated clamp circuit coupled between the emulator input and the emulator output in parallel to the first current path; and
enabling, on a fourth condition that the forward current is equal to or greater than a forward current threshold, the active shunt-regulated clamp circuit.

26. The method of claim 25, further comprising:
generating a forward voltage at the emulator input;
in response to the fourth condition being satisfied, clamping, by the active shunt-regulated clamp circuit, the forward voltage is to a fixed forward voltage in response to the fourth condition being satisfied; and
in response to the third condition being satisfied, generating the forward voltage in proportion to the forward current.

* * * * *